United States Patent [19]

Elkind et al.

[11] Patent Number: 5,318,666

[45] Date of Patent: Jun. 7, 1994

[54] METHOD FOR VIA FORMATION AND TYPE CONVERSION IN GROUP II AND GROUP VI MATERIALS

[75] Inventors: Jerome L. Elkind, Dallas; Glennis J. Orloff, Plano; Patricia B. Smith, Grapevine, all of Tex.

[73] Assignee: Texas Instruments Incorporated, Dallas, Tex.

[21] Appl. No.: 49,755

[22] Filed: Apr. 19, 1993

[51] Int. Cl.⁵ ............................................ H01L 21/00
[52] U.S. Cl. ............................ 156/643; 156/644; 156/646; 437/185; 437/228; 437/904; 437/905
[58] Field of Search ............... 156/643, 646, 644; 437/225, 228, 904, 905, 906, 185

[56] References Cited

U.S. PATENT DOCUMENTS

| | | | |
|---|---|---|---|
| 4,734,152 | 3/1988 | Geis et al. | 156/646 |
| 4,838,984 | 6/1989 | Luttmer et al. | 156/643 |
| 5,017,511 | 5/1991 | Elkind et al. | 156/646 |
| 5,157,000 | 10/1992 | Elkind et al. | 156/643 X |

OTHER PUBLICATIONS

Spencer et al, "Methyl Radical Etching of Compound Semiconductors with a Secondary Afterglow Reactor", J. Vac. Sci. Technol. A, Vac. Surf. Films (USA), vol. 8, No. 3, pt. 1, pp. 1690–1695, May–Jun. 1990.
Foad et al, "Reactive Ion Etching of II–IV Semiconductors Using a Mixture of Methane and Hydrogen", Electron. Lett. (UK), vol. 27, No. 1, pp. 73–75, 3 Jan. 1991.

*Primary Examiner*—Thi Dang
*Attorney, Agent, or Firm*—Richard A. Stoltz; James C. Kesterson; Richard L. Donaldson

[57] ABSTRACT

A method of forming an n-p junction in a body (44, 44a, 44b) formed of Group II and Group VI elements. The body (44, 44a, 44b) initially is of p-type conductivity characteristic, and a dry reactive etching process is employed for forming a via (60, 60a, 60b) in the body by a chemical reaction which is also effective to type convert a portion of the body adjacent the via. An n-doped region (64, 64a, 64b) is thereby formed within the body around the via and between the via and the remaining, p-doped region of the body, thereby defining an n-p junction. In one embodiment, the body is mounted on an electrical device (50, 50a, 50b) having an input contact pad (58, 58a, 58b), and an electrically conductive layer (62, 46a, 90) is formed in connection with the contact pad and the n-doped region adjacent the via. In one application, a plurality of the n-p doped via junctions are formed in laterally spaced orientation for providing an array of infrared radiation sensitive photodiodes (24, 24a, 24b), the n-doped region of each diode having electrical connection with a respective contact pad of the electrical device.

18 Claims; 3 Drawing Sheets

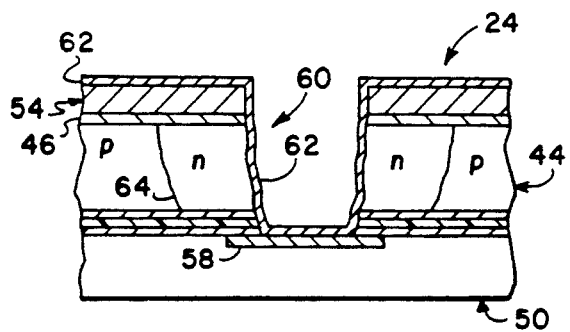
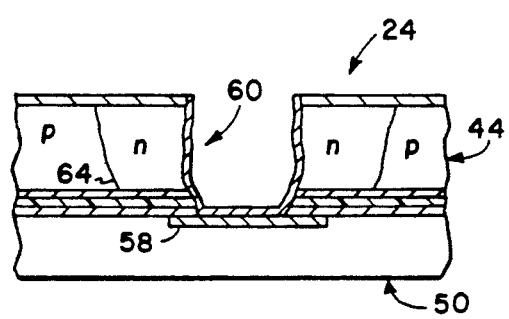
FIG. 5    FIG. 6
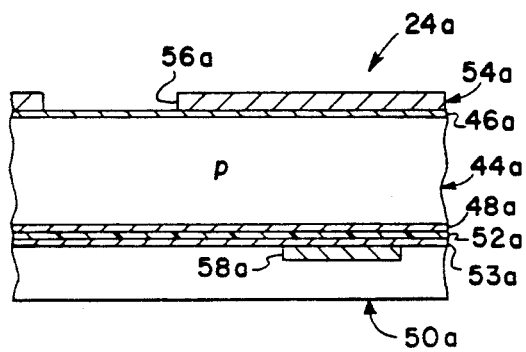
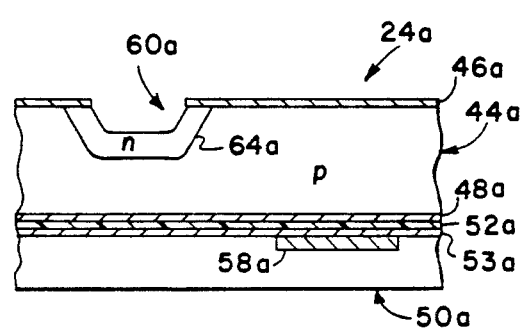
FIG. 7    FIG. 8
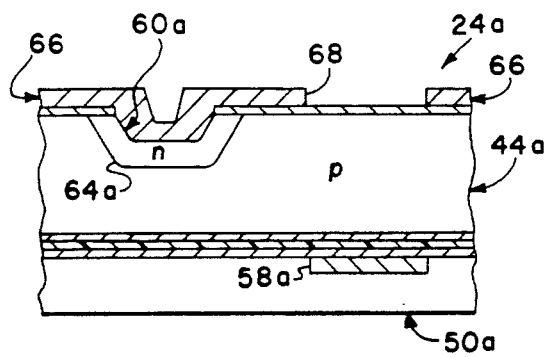
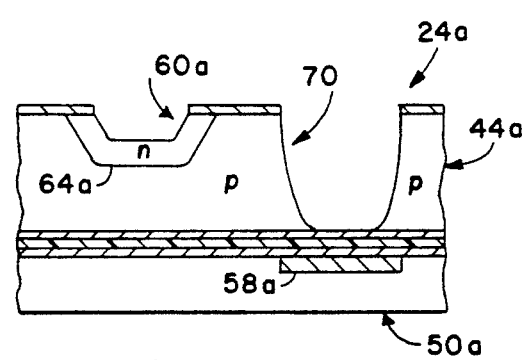
FIG. 9    FIG. 10
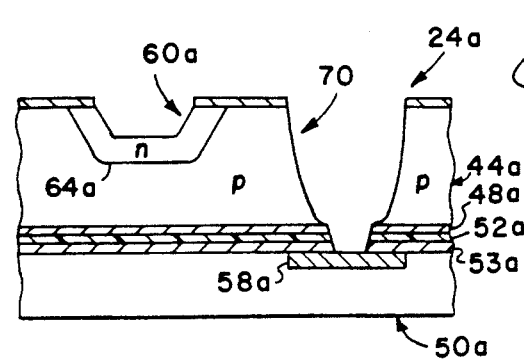
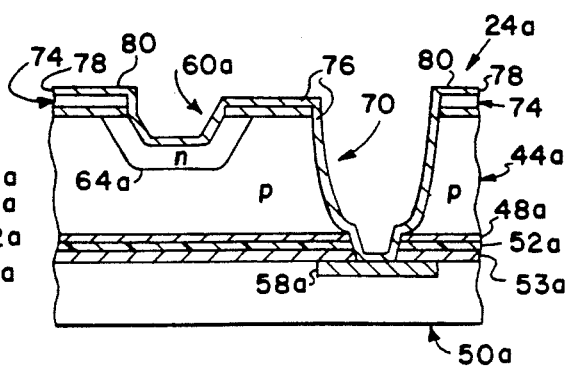
FIG. 11    FIG. 12

METHOD FOR VIA FORMATION AND TYPE CONVERSION IN GROUP II AND GROUP VI MATERIALS

TECHNICAL FIELD OF THE INVENTION

This invention relates in general to the dry etching of integrated circuits and, more particularly, to a reactive dry etch process for forming a via in a p-doped substrate having Group II and Group VI elements, such as mercury cadmium telluride (p-HgCdTe), whereby type conversion of a region of the substrate is effected during the reactive dry etch process.

BACKGROUND OF THE INVENTION

Semiconductors having elements from Group II and Group VI of the periodic table, such as mercury cadmium telluride, have been advantageously used in the fabrication of infrared radiation detectors and imagers which operate in the lower infrared frequency band down to the limits of the available long wave length atmospheric window, i.e., at wave lengths of 8-12 microns. The detection of such long wave length radiation, if it is to be done using a detector at only moderate cryogenic temperatures, e.g., at liquid nitrogen rather than liquid helium temperatures, is preferably done using a very narrow bandgap semiconductor, such as $Hg_{1-x}Cd_xTe$. Such alloys are referred to generically as "HgCdTe". This pseudo-binary alloy, if it has a composition such as $X=0.2$, will have a bandgap small enough, e.g., 0.1 V, to be bridged by 12 micron photons. In conventional methods for forming detector arrays, photodiodes have been used as optical detectors and have been interconnected with various forms of image processing circuitry. In the formation of such arrays of photodiodes, vias have been formed within the surface of a HgCdTe substrate, and diodes, each formed at a junction of n-type and p-type semiconductor material, have been associated with each via for forming individual photodetectors, each photodetector forming a pixel within the photodetector array.

In the formation of such detectors, it is important that the vias are precisely formed and that their maximum diameters are limited so that the resulting photodetectors can be closely spaced to enhance the resolution of the resulting photodetector array. Such photodetector structures may be formed of bodies or wafers including compounds of the Group II and Group VI elemental groups of the periodic table, such as HgCdTe, and normally have a zinc sulfide (ZnS) or cadmium telluride (CdTe) layer deposited on the HgCdTe wafer to act as a passivation layer and an insulator for the detector. A photoresist pattern is typically formed above the insulating layer, the photoresist pattern having a plurality of openings mutually spaced in accordance with the desired photodetector array pattern, and in accordance with the resolution desired. Vertically integrated detectors forming such infrared focal plane arrays require that, for each pixel, a via is extended through the HgCdTe wafer.

In the past, various forms of etching and drilling processes have been used to form such vias. In vacancy-doped p-HgCdTe, the vias are generally separate, and spaced from the active (diode) area, and they have been formed using a wet etch process in order to avoid unwanted type conversion. However, the isotropic nature of wet etch processes severely limits the resolution and minimum pixel size obtainable. In order to reduce pixel size, dry etching has been used to form the vias. For example, dry etching techniques utilized for etching HgCdTe and ZnS wafers have, in some applications, used energy from a remote microwave plasma discharge apparatus for activating an etchant to reactively remove selected portions of HgCdTe and ZnS wafers. In other applications, dry etching of a wafer made of Group II and Group VI elements is accomplished by placing the wafer on a substrate in a reaction vessel, evacuating the vessel, and generating an in situ plasma in a gap between two parallel plates within the vessel by applying an electric field across the plates, causing electrons to traverse the gap. The continuous activity of electrons within a hydrocarbon and/or hydrogen gas, such as methane, held at a constant pressure within the reactor causes activation of the gas to disassociated and ionized species, which then etch the exposed areas of the substrate to form the vias. In the past, as exemplified in U.S. Pat. No. 5,157,000, such dry etching processes have been performed on compounds of Group II and Group VI elements, and subsequent procedures such as milling and ion implant processes have been required to form the necessary n/p junctions for forming diodes.

In another process (U.S. Pat. No. 4,411,732), type conversion of a HgCdTe substrate is accomplished by the use of an ion-beam milling process to form photovoltaic infrared detector devices having n/p junctions as the photosensitive junctions. A passivating layer of zinc sulphide is deposited on the upper surface of a material having p-type conductivity characteristics, and at least a portion of the surface of the body is bombarded with ions at very high energy levels, e.g., 500V, to etch away a portion of the body. For example, energetic argon ions or atoms may be directed at the surface at high energy levels. Such high energy ion bombardment disturbs and breaks up the crystal lattice within the substrate, loosening some of the mercury atoms, and thereby produces a sufficient excess concentration of mercury from the etched-away portion of the structure to act as a dopant source for converting an adjacent part of the body into material having n-type conductivity characteristics, thereby forming the n/p junction. Ion bombardment milling processes thus produce a physical, rather than chemical, reaction with the lattice of the substrate, damaging the lattice in order to free the mercury and cause type conversion within the adjacent regions. Such ion milling processes entail several inherent limitations and disadvantages. For example, the high energy bombardment of the Group II-Group VI lattice may not be selective in its reactance with various elements, and although highly anisotropic, redeposition occurs, producing vias of low aspect ratios and thus limiting the pixel size and resolution of the resulting photodiode array. Such ion milling procedures thus entail limitations and disadvantages in that: (1) they are not as flexible as desired for controlling the extent of type converted material, (2) they do not produce vias having sufficiently high aspect ratios for achieving the small pixel size desired for high resolution photodetector arrays, and (3) they are not selective in their milling action against successive layers of various types of materials.

SUMMARY OF THE INVENTION

The present invention comprises a method for forming vias within a vacancy doped, p-type substrate having Group II and Group VI elements while also effecting p to n-type conversion of the adjacent material, by means of a chemical reaction induced by a chemically reactive plasma, such as a reactive ion etching (RIE) process. A hydrogen or hydrocarbon gas source, such as methane, is excited, by means such as an RF energy source, in a plasma reactor to form reactive species in the form of reactive ions or plasma. Upon excitation by the RF source, the gas contains several activated species, such as ions and radicals. The activated species are reacted with an exposed surface of the p-doped Type II/Type VI substrate, resulting in a chemical reaction between the activated gas and the Group II and Group VI compounds which produces volatile, hydrogenated and/or alkylated metallic species necessary for etching the compounds. While the exact nature of the resulting p-to-n-type conversion is not fully understood, it is believed that during the reactive process a small amount of the Type II element, such as mercury, is disassociated and diffused into the lattice crystal as interstitial metal, filling vacancy sites in the crystal and converting a portion of the material from p to n-type conductivity characteristics, therefore forming an n/p diode junction at the interface between the locally n-doped region and the surrounding p-doped region. In one embodiment, a vacancy doped p-HgCdTe substrate is utilized, vacancy doping of the substrate being accomplished by means, known in the art, such as nonstoichiometric annealing, wherein the temperature of the wafer is sufficiently elevated to provide the desired vacancy concentration.

The present invention thus entails the forming of n/p junctions providing IR sensitive photodiodes in Group II-Group VI compound semiconductors by the use of a chemically reactive dry etching process. In one aspect of the invention, a method is provided for etching and type conversion of a p-doped wafer made of Group II and Group VI elements, such as HgCdTe, wherein the vacancy-doped p-HgCdTe wafer has a ZnS or CdTe passivation layer on its underside, the wafer being mounted on an integrated circuit, such as a read-out integrated circuit (ROIC), and thinned to approximately 10 microns. A ZnS or CdTe passivation layer is then applied on the upper surface of the HgCdTe wafer, and the wafer is patterned for the via-junction formation process by the application of a photoresist layer pattern corresponding with the pattern of electrically conductive contact pads of the integrated circuit. Vias are then formed in the wafer by means of the chemically reactive etching process. Suitably, a reactive ion etching or reactive plasma etching process is performed at a 2,000 Å/min. rate. In one embodiment, the resulting vias may extend completely through the HgCdTe wafer. In another embodiment, the vias extend partially within the wafer, to a precisely controlled depth. As the vias are being formed, the reactive etching process effects type conversion to form an n-doped region within the surrounding, p-type Group II-Group VI material.

After the vias have been formed and the wafer has been removed from the dry etching apparatus, a wet chemical etchant, such as a solution of bromine and methanol, may be applied to the dry etched portions of the wafer to smooth and expand the vias to the desired dimension. After the vias have been wet etched, the photoresist pattern is removed from the surface of the wafer. In one embodiment, a contact metallization step is then employed for connecting the n-doped region, produced during the via formation step, to a respective, adjacent contact pad of the associated integrated circuit.

In accordance with one aspect of the invention, the reactive etching process utilizes an in situ generated plasma which is capable of dry etching compounds having Group II and Group VI elements, such as mercury, cadmium, tellurium, zinc, sulfur, selenium, or combinations thereof. The free-radical-containing activated gas may comprise hydrogen, ethane, propane, and other hydrocarbons, or a combination thereof. In the preferred embodiment, the temperature of the wafer is maintained between approximately 15° C. and approximately 180° C. during etching to ensure that the layers are not damaged by excessive heat. Additionally, the hydrocarbon or hydrogen gas used as the etchant gas may be mixed with an inert gas within the etching chamber. The inert gas may be argon, helium, neon, or a combination thereof.

The present invention entails several technical advantages over prior techniques for forming photodiodes. High energy ion bombardment processes are not utilized, and the previously discussed disadvantages entailed therein, i.e., low selectivity, redeposition, and limited aspect ratio, are obviated. Instead, the chemically reactive etching process employed in the present invention forms fine, consistent vias while also performing localized type conversion of the adjacent material to form an integral n/p junction. The size of the n-type region formed during the reactive ion etching process may be reliably controlled and is dependent on the vacancy concentration of the starting Group II-Group VI material and the size, i.e., the diameter and depth, of the via. Additionally, the present invention presents technical advantages inherent in its ability to flexibly control the extent of type converted material, its highly anisotropic etch profile capability, and its high selectivity.

BRIEF DESCRIPTION OF THE DRAWING

Other aspects of the invention and their advantages may be appreciated with reference to the following detailed description taken in conjunction with the appended drawings in which:

FIGS. 2-6 are successive, schematic, magnified cross-sectional views of an integrated circuit structure showing successive steps in the fabrication of a vertical via and diode in accordance with one embodiment of the process of the present invention, wherein the thicknesses of certain layers have been exaggerated for clarity;

FIGS. 7-13 are successive, schematic, magnified cross-sectional views of an integrated circuit structure showing successive steps in the fabrication of a laterally extending via and laterally connected diode formed according to a second embodiment of the process; and FIG. 14 is a schematic, magnified cross-sectional view of an integrated circuit structure formed in accordance with a third embodiment of the process.

DETAILED DESCRIPTION OF THE INVENTION

Figure 1:
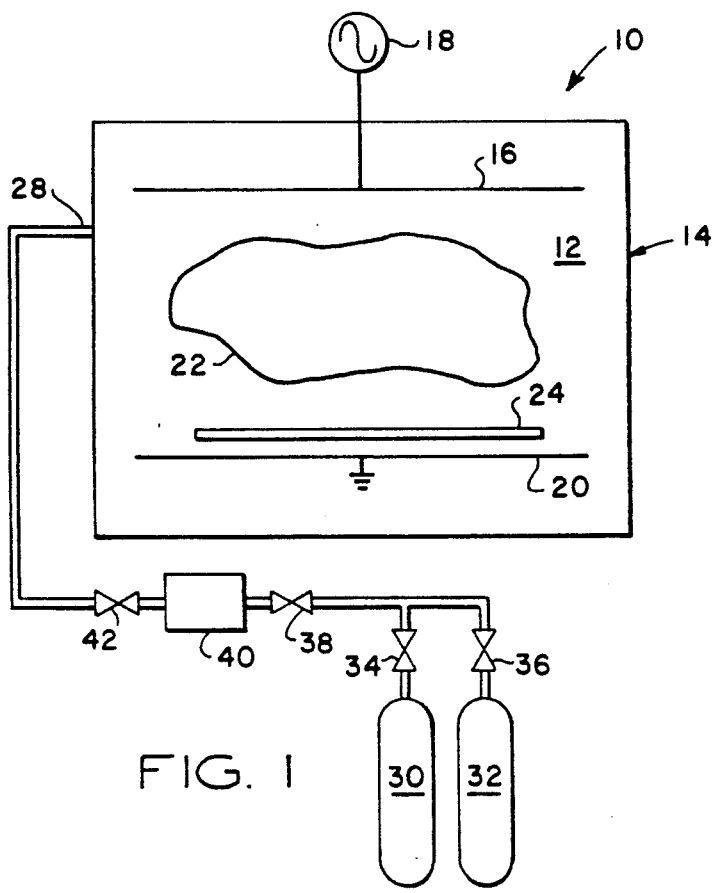
FIG. 1 is a schematic diagram of an apparatus utilized in the reactive etching process.

Referring initially to FIG. 1, a schematic representation of an etching apparatus 10 utilized in the present invention is provided. Apparatus 10 is what is commonly known as a plasma reactor, and one example of such a reactor is described in detail in U.S. Pat. No.

4,838,984. A reactor chamber 12 is defined within vessel 14 for use in the reactive etching process, the apparatus 10 being capable of maintaining an internal pressure of between approximately 0.001 to 10 torr. A substrate or wafer structure 24, to be described, having a p-doped body 44 (FIG. 2), is loaded into the chamber 12 and maintained at a temperature of between approximately 15° and 180° C. An RF power electrode 16 is connected to an RF power source 18 which, in one embodiment, can generate 150 watts at 13.56 megaHertz. Vessel 14 includes a ground or substrate electrode 20 and, during the reactive etching step of the process, the distance between electrode 20 and the electrode 16 is maintained in a range of approximately 2 to 6 inches, and preferably at approximately four inches. A plasma 22 is formed between electrodes 20 and 16 and in contact with wafer structure 24. Inlet 28 to vessel 14 conducts the gaseous etchant into chamber 12 from active-gas source 30. In the preferred embodiment, the gas etchant comprises hydrogen and/or a hydrocarbon. The preferred use of methane will be more fully discussed hereinbelow, and ethane is also satisfactory. Additionally, inert gas source 32 can be provided for supplying an inert gas, which is mixed with the reactive gas from source 30. The inert gas from source 32 can comprise argon, helium, neon, or a combination thereof. Valves 34 and 36 are utilized to control the relative flows of the gases from sources 30 and 32, and active gas from source 30 is initially conducted through valves 34 and 36 and flow control valve 38 into a mixing chamber 40. Inert gas from source 32 is released through valves 36 and 38 into the mixing chamber 40. When mixed, the gaseous etchant species proceed through valve 42 to chamber 12, wherein the gas is activated through excitation by radio frequency (RF) energy from source 18 to produce the chemically reactive plasma 22.

Figure 2:
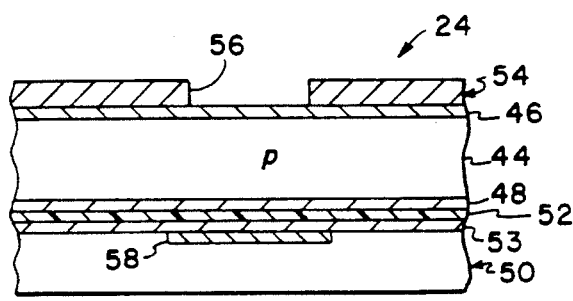

Referring now to FIGS. 2-6, a fragmentary portion of the wafer structure 24 is shown. In the embodiment of the method illustrated in FIGS. 2-6, a "vertical" photodiode is formed which, in association with a plurality of other, similar photodiodes (not shown) which are mutually and laterally spaced on either side of the illustrated portion of the wafer structure, forms an infrared focal plane photodetector or photodiode array, each photodiode within the array corresponding to a single pixel of the photodiode array. With respect to the formation of the wafer structure 24, in summary, and with reference initially to FIG. 2, the wafer structure 24 includes a body 44 of a vacancy doped p-type semiconductor material having elements from the Group II and Group VI elemental groups of the periodic table. In the embodiment of FIGS. 2-6, body 44 is a generally planar slice of the p-type Group II/Group VI material. The semiconductor material suitably consists substantially of mercury cadmium telluride (HgCdTe), mercury manganese telluride (HgMnTe), or mercury zinc telluride (HgZnTe). As indicated above, passivation layers 46 and 48, suitably of zinc sulphide or cadmium telluride, are deposited on the upper and lower surfaces of the p-type body 44, in the present embodiment, and the body is then mounted on a semiconductor circuit chip 50, such as a "Read-Out Integrated Circuit," by means of a layer 52 of an epoxy adhesive. A mask 54 of photoresist material is applied over the upper passivation layer 46 and includes at least one bore or opening 56. When utilized in the formation of multiple diodes, e.g., of a photodetector array having multiple photodetectors, the mask 54 includes a plurality of openings 56 which are suitably patterned and mutually spaced in accordance with the desired pattern of the diodes of the infrared photodetector array to be fabricated. As shown in FIG. 2, each opening 56 is aligned in register with a conductive electrical input element or pad 58 of the integrated circuit device 50.

In accordance with a preferred embodiment of the invention, the body 44 is of p-type HgCdTe having an acceptor concentration of $10^{16}/cm^3$ and a mobility of $5 \times 10^2\,Cm^2V^{-1}Sec^{-1}$. In its broader scope, the Group II-Group VI material of body 44 may include other compounds of the Group II and Group VI elemental groups, as discussed above, as well as additional elements.

Whereas the active gas source 30 may comprise hydrogen, methane, propane, other hydrocarbons, or a combination thereof, as indicated above, the preferred etchant source is methane, because the dimethyl compounds are more volatile than the larger hydrocarbon compounds, and the resultant, high volatility is a desirable feature of the chemical etching reaction. If, alternatively, larger hydrocarbon gasses are used as the etchant species, the gasses are more likely to polymerize, resulting in potential contamination of the wafer structure and the reactor surfaces. In its preferred embodiment, the present invention uses in situ RF plasma exitation to produce reactants with sufficient energy for chemical reaction with the HgCdTe compound. That is, volatile species must form from the reaction of the active gas with components of the p-doped body 44. The activation of methane by an RF plasma can be defined by the equation:

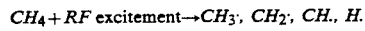

$$CH_4 + RF\ excitement \rightarrow CH_3\cdot,\ CH_2\cdot,\ CH\cdot,\ H.$$

In accordance with the preferred embodiment, the in situ RF plasma source is thus utilized to generate activated methyl or hydride etching species, which dry etch the Group II/VI compounds. Whereas the RF plasma generating process is preferred because of its reliability and its relative ease, other processes for generating reactive gaseous species, such as remote microwave plasma generation, may be utilized to excite the active gas.

In the operation of the RF-powered diode plasma reactor 10, the two plates 16 and 20 are mutually parallel and separated by approximately 4 inches. When power from the RF power source 18 is applied to plate 16, electrons are forced to flow from one plate to the other. To enhance the flow of electrons, the pressure within the vessel 14 is preferably maintained at less than 500 torr. As is known in the art, as the electrons traverse the gap between plates 16 and 20, the electrons accelerate, producing collisions of the electrons with the methane and causing the disassociation and ionization necessary for activating the etchant. The inert gas 32 is mixed with the active etchant gas 30 to enhance the etching of the HgCdTe layer. When methane and/or hydrogen are used as the active chemical etchant, argon is suitably used as the carrier or buffer gas. The desired etching rate, and the extent of type conversion within the MCT material, for the process is dependent upon the percentage of the hydrogen gas and the pressure. Also, lower RF power levels tend to reduce the etching rate.

The following equations set forth the chemical reactions which produce the p→n type conversion which occurs when vacancy-doped p-HgCdTe is reactive ion or plasma etched, using hydrogen:

$$H_2 + e^- \rightarrow 2H \cdot + e^- \quad (1)$$

$$2H \cdot + Hg(L) \rightarrow (1-x)HgH_2 \uparrow + xHg(i) \quad (2)$$

$$Hg(i) + Hg(v) \rightarrow Hg(L), \quad (3)$$

where $H_2$ is a molecule of hydrogen gas, $e^-$ is an energetic electron produced by a microwave or RF discharge, $H \cdot$ is a hydrogen radical, $Hg(L)$ is a lattice mercury atom in HgCdTe, $HgH_2$ is a volatile mercury hydride, $Hg(i)$ is a mercury interstitial atom, and $Hg(v)$ is a mercury vacancy site.

Equation (1) represents the dissociation of a hydrogen molecule to form two highly reactive hydrogen radicals. Equation (2) describes the reaction of hydrogen radicals with a mercury atom in the HgCdTe lattice. Generally, x is much less than one ($x << 1$). Thus, most of the mercury leaves the surface as a reaction product, such as mercury hydride, but a small amount is able to diffuse into the crystal as interstitial mercury. Equation (3) reveals how the resulting interstial mercury is effective for filling vacancy sites. Since the dominant charge carrier in the starting material is the vacancy site, which is an acceptor, equation (3) also defines the process by which the material is converted to n-type characteristics.

An alternative set of equations, using methane as the process gas, is as follows:

$$CH_4 + e^- \rightarrow CH_3 \cdot + H \cdot + e^- \quad (1)$$

$$2CH_3 \cdot + Hg(L) \rightarrow (1-x)Hg(CH_3)_2 \uparrow \times xHg(i) \quad (2)$$

$$Hg(i) + Hg(v) \rightarrow Hg(L), \quad (3)$$

where $CH_4$ is a molecule of methane gas, $CH_3 \cdot$ is a methyl radical, $Hg(L)$ is a lattice of mercury atoms in HgCdTe, and $Hg(CH_3)_2$ is the volatile reaction product, i.e., dimethyl mercury. In practice, both of these reactions occur simultaneously, along with a number of other reactions.

It is important to maintain wafer structure 24 at a relatively constant and low temperature during the reactive etching process. More specifically, it is preferable to control the temperature of the wafer structure 24 in the chamber 12 at between approximately 15° C. and approximately 180° C. to ensure that the HgCdTe layer is not damaged during processing.

With continued reference to FIGS. 2–6, in the initial embodiment of the method, which produces a "vertical diode" as shown in FIG. 6, the chemical etching process is continued at a rate of about 2,000 per minute until the resulting via 60 is formed completely through the Group II-Group VI material 44. The chemical reaction of the reactive elements, such as $CH_3$ and H radicals, with the Group II-Group VI material is effective both to etch away the sacrificial material during the formation of via 60, and also to effect p- to n-type conversion of the portion of the Group II-VI material adjacent and surrounding the via 60. As may be seen in FIGS. 3–6, an n-doped region 64 of tapered, approximately frustoconical configuration is formed in the region immediately surrounding the via 60, thereby providing an n/p junction between the n-doped region 64 and the remaining p-doped material.

Figures 3, 4:
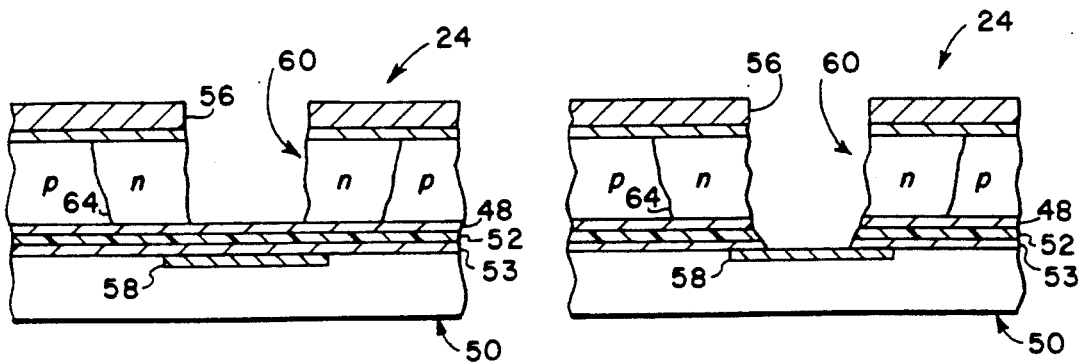

To complete the formation and electrical interconnection of the vertical diode device, the via 60 is extended downwardly, as viewed in the drawing, by the etching of openings through the lower passivation layer 48, epoxy layer 52, and silicon oxide layer 53 to expose the contact pad 58, as shown in FIG. 4. More specifically, the extension of via 60 through layers 48, 52, and 53 is completed using plasma dry etching processes appropriate for the materials of the respective layers. For example: (1) a methane hydrogen or hydrogen-based, plasma etch is suitably used to remove the passivation layer 48; (2) an oxygen-based etch is suitably used to remove the epoxy layer 52; and (3) a fluorine-based etch is suitably used to remove the oxide layer 53. Preferably, a wet etching process is then used to smooth the surfaces of the resulting via. Referring to FIG. 5, an electrically conductive layer 62 is then formed over the photoresist masking layer 54, and within via 60, in electrical contact with both the n-doped region 64 of the Group II-VI material 44 and the IC circuit contact pad 58. Suitably, the conductive layer 62 is a layer of indium metal applied by sputter deposition, or other suitable means. The photoresist masking material 54 and the portions of the conductive layer 62 extending above the passivation layer 46 are then removed by a lift process, by the application of a solvent, or by other suitable means, to form the photodiode device as seen in FIG. 6.

The resultant structure provides an n/p diode. In the illustrated example, the diode is thus an IR-sensitive photodiode in electrical contact, through conductive layer 62 and contact pad 58, with the integrated circuit 50. Output signals produced by the photodiode upon being illuminated by infrared radiation are thus conducted through conductive layer 62 to the circuit device 50, which in one application functions to process the inputs received from each of the plurality of photodetectors in the photodetector array, to form electrical signals corresponding with the image pattern sensed by the array.

EXAMPLE I

An experiment was conducted to provide a vertical photodiode device in vacancy-doped p-HgCdTe using reactive ion etching to form the active n/p junction, in accordance with the process which has just been described with reference to FIGS. 2–6. The via 60 was etched completely through the p-HgCdTe material. In the experiment, a vacancy doped p-HgCdTe slice was provided as discussed above. The vacancy doped p-HgCdTe starting material was first passivated on its underside, using ZnS, and was then mounted on an integrated circuit 50 having a conductive input element or pad 58 for contacting the diode. In the experiment, the integrated circuit 50 was a read-out integrated circuit (ROIC). The p-HgCdTe slice was then thinned to approximately 10 microns by chem-mechanically polishing the slice with a bromine methanol solution. Passivation of the front surface followed, utilizing zinc sulfide. The slice was then patterned for the via-junction formation process using a photoresist layer having openings, one of which is shown at 56 in FIG. 2, sized and mutually spaced in accordance with the physical arrangement of the contact pads of the ROIC integrated circuit. The wafer was then chemically etched by the reactive ion etching process. During processing, 1150 sccm of hydrogen and 300 sccm of methane were introduced into the chamber 12 (FIG. 1), and the pressure within the chamber was held at 0.6 torr. Once the gas was introduced into the chamber 12, the RF power source was energized, applying approximately 50 Watts to the electrode 16, which was heated to 90° C. The etching process was continued for approximately three minutes and resulted in diode formation, i.e., conversion of the p-type HgCdTe to n-HgCdTe, in the region immediately adjacent to the reactively etched via, thus producing an n/p junction. In the present example, the maximum diameter of the via was 8 microns, and the via depth was 7 microns, which was the thickness of the HgCdTe layer. The vacancy concentration was $3 \times 10^{16}/cm^3$, and the diameter of the resulting n-HgCdTe region was approximately 30 microns.

Subsequently, layers 48, 52 and 53 were cleared and removed by successive plasma etching processes. An etching solution of bromine and methanol was then applied to the dry etched portions to smooth and slightly expand the via. Electrical contact between the n-doped region 64 and the contact pad was next provided by sputter depositing an indium metal over the HgCdTe slice, then removing the resist, leaving the conductive metal layer within the via.

As shown in FIGS. 7-13, in a second embodiment of the method effective for forming a "lateral diode," lateral via 60a (FIG. 8) is not formed completely through the p-doped, Group II-VI material 44a, but instead is formed as a cavity extending only partially within the material. With initial reference to FIG. 7, wafer structure 24a includes a vacancy doped body 44a of p-type electrical conductivity characteristics, formed of a compound substantially of Group II and Group VI elements, as in the previous example Passivation layers 46a, and 48a, of ZnS or CdTe, are formed on the upper and lower surfaces of the Group II-VI p-doped body 44a, as in the first embodiment. The Group II-VI body 44a need not be thinned to a desired thickness for defining the via depth, as in the first embodiment, since the via 60a is not extended completely through the Group II-VI material, and its depth is therefore not directly dependent upon the thickness of the body 44a. The structure is then mounted on an integrated circuit device 50a by means of a suitable adhesive 52a, preferably an epoxy as in the first embodiment. As in the first embodiment, integrated circuit 50a includes a plurality of conductive contact pads, such as contact pad 58a, and typically has a silicon oxide layer 53a formed on its upper surface A first photoresist mask 54a (FIG. 7) is then formed over the upper surface of upper passivation layer 46a, the first photoresist mask 54a having an opening 56a. In the present embodiment, the opening 56a is of a diameter somewhat greater than that of the opening 56 utilized in the first embodiment of the method discussed with reference to FIGS. 2-6, thereby producing a somewhat wider, larger "lateral" via 60a, resulting in a larger n/p junction 64a having greater collection efficiency. In contrast with the method of the embodiment of FIGS. 2-6, the opening 56a is not formed in vertical alignment or register with contact pad 58a, but instead is laterally offset from the pad.

With reference to FIG. 8, the reactive etching process is terminated before the resulting "lateral" via 60a is extended through the Group II/Group VI material 44a. Next, the first mask 54a (FIG. 7) is removed by a chemical lift procedure. The resulting via 60a (FIG. 8) thus extends partially within the Group II-Group VI layer 44a, in accordance with the desired size of the n/p junction. As in the first embodiment, the region 64a around the via cavity 60a is type converted from p to n-conductivity. This results in a widened, cup-shaped, n-doped region 64a extending around and under the via 60a, but not extending completely through the structure 44a or toward the integrated circuit 50a. With reference now to FIG. 9, a second photoresist mask 66 is then formed over the structure 24a covering the via 60a, the mask 66 having an opening 68 located over and in alignment with the contact pad 58a. The structure 24a is then wet etched, suitably by a bromine methanal solution such as a 1/16th percent concentration of bromine in methanol, to form a vertical via 70 which extends completely through the Group II-Group VI material 44a, as seen in FIG. 10. Suitable dry etching processes are then employed, as discussed above with respect to the first embodiment, to extend the via by forming openings through layers 48a, 52a, and 53a, thereby exposing the conductive pad 58a, as shown in FIG. 11. The second mask 66 (FIG. 9) is then removed. Since a wet etching procedure, rather than the reactive dry etch, is used in this step, the Group II-Group VI material adjacent via 70 is not type converted during this procedure.

Figures 13, 14:
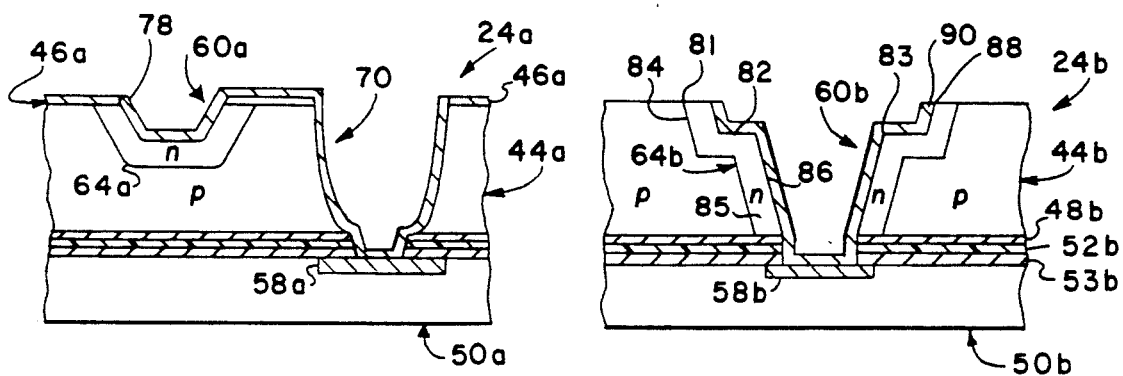

Referring now to FIG. 12, a third photoresist mask 74 is then formed over the portions of the upper surface of structure 24a outside the lateral via 60a and the vertical via 70, leaving a non-masked region 76 which includes and extends between the lateral via 60a and the vertical via 70. Subsequently, a conductive layer 78, suitably of indium, is formed over the masked structure 24a, suitably by sputter deposition, whereby it provides electrical contact between the n-doped region 64a surrounding the lateral via 60a and the conductive contact pad 58a of the integrated circuit 50a. Next, the third photoresist mask 74, along with the adjacent portions 80 of conductive layer 78, are removed, providing the finished lateral diode structure 24a as shown in FIG. 13, wherein conductive layer 78 provides electrical contact between the n-doped region 64a and the IC contact pad 58a for completing the circuit between the lateral photodiode and the integrated circuit.

EXAMPLE II

The following experiment was conducted in the laboratory for forming a lateral photodiode device, using a reactive ion etching (RIE) process for forming a lateral via 60a in a Type II-Type VI body 44a, to provide the n-p junction.

A shallow, lateral via 60a was formed, by the reactive ion etching apparatus 10 as described above with respect to Example I, in p-type vacancy doped Group II/Group VI material consisting essentially of HgCdTe. The vacancy doped p-HgCdTe starting material was first passivated on its underside by an application of zinc sulfide (ZnS). The body 44a was then mounted on a ceramic carrier to facilitate handling. Passivation of the front surface followed, utilizing ZnS. Then, the body was patterned for the via-junction formation process, using a photo-resist layer pattern 54a.

Vias were then formed in the p-HgCdTe body 44a by the reactive ion etching process, one such via 60a being shown in FIG. 10. As in the first example, a mixture of hydrogen and methane was introduced into the reaction chamber 12 (FIG. 1) at a rate of 1150 sccm of hydrogen and 300 sccm of methane, and the pressure was held at 0.6 torr. Following the introduction of gas into the chamber 12, the RF power source 18 was energized to apply approximately 50 watts of power to the connected electrode 16, which was heated to 90° celsius. The bias was 90 Volts. The resulting reactive etchant species reacted chemically with the portions of the p-HgCdTe wafer structure 24a not protected by the photoresist layer 54a to form via cavities such as via 60a, converting the p-type HgCdTe to nHgCdTe in the regions 64a immediately adjacent to the vias 60a. The vias 60a were formed in the substrate by etching for approximately three minutes and were approximately 12 microns in diameter and 5,000 angstroms deep, the vacancy concentration being approximately $\times 10^{16}/cm^3$. The size of the n-type region 64a formed during the reactive ion etching process is dependent on the vacancy concentration of the starting p-HgCdTe and the size (diameter and depth) of the via as well as the chemistry. In the present experiment, the n-HgCdTe regions 64a were approximately 6 microns in diameter. In this experiment, wherein the vias were not etched all the way through the body 44a, electrical contact between the n-type region 64a and the contact element 58a was subsequently made, using a conventional metallization process, by sputter depositing an indium layer in the vias.

Referring now to FIG. 14, a photodiode 24b formed by a third embodiment of the process includes a via 60b formed by a two-phase reactive etching procedure. The Group II-Group VI body 44b is initially masked to define an opening, above circular region 88, and aligned with conductive pad 58b, as in the method described above with reference to FIGS. 2–6. The structure 24b is then placed in the reactive etching chamber 12 (FIG. 1) and reactively etched only for a period sufficient to form a lateral via portion 82, in accordance with the procedure described above with reference to FIGS. 7 and 8, whereby shallow, relatively wide via 82 and an adjacent, shallow n-doped region 84 are formed, of a configuration similar to that described above with respect to via 60a, FIG. 8. Subsequently, the first mask is removed, and a second mask, not shown, is applied to the structure, the second mask having an opening of smaller diameter than that of the opening in the first mask and located coaxially within the via portion 82, over the central portion indicated at 83, in alignment with and over the conductive pad 58b. The structure is again placed in the reactive etching chamber 12 and reactively etched to form vertical via portion 86, which extends completely through the Group II-Group VI body 44b, in accordance with the procedure described above with reference to FIGS. 2 and 3, thereby type-converting the adjacent Group II—Group VI material. The n-doped region 64b is thereby extended to form a vertical portion 85 of the n-doped region 64b. Subsequently, the via 60b is extended, suitably by a series of dry etching processes as discussed above, through the passivation layer 48b, the epoxy layer 52b, and the silicon oxide 53b, to expose the conductive pad 58b of integrated circuit 50b. The second mask is then removed, and a third mask, not shown, is applied having an opening preferably coinciding with the outer diameter 88 of the upper, laterally extending via portion 82. Conductive metallization layer 90 is then formed within the via 60b, suitably by sputter deposition of an indium metal, whereby electrical connection is provided between the n-doped region 64b and the conductive pad 58b. The third mask and any excess indium metal are then removed. It is also possible to reverse the above-described masking and etching sequence, by forming the narrow, "vertical" via portion 86 first, and subsequently forming the wider, "lateral" portion 82.

The photodiode structure 24b (FIG. 14) thus provides what may be termed a vertically and laterally extending via 60b, having a vertically and laterally extending n-doped doped region 64b, thereby combining in one via desired characteristics of the photodiode structures formed by the first and second method embodiments, as described above with reference to FIGS. 2–6 and 7–13, respectively. That is, the laterally extending, n-doped region 84 provides an n-p junction of greater area and more response than that of a more narrow, vertically oriented via, and the continuation of via 60b, through vertical via portion 86, permits the provision of a direct, electrically, conductive pathway, through conductive layer 90, to the contact pad 58b of integrated circuit 50a, thereby eliminating the need for an additional, vertical connecting via such as that shown at 70 in FIGS. 11 and 12. Additionally, the cross-sectional area of the resulting diode structure of FIG. 14, i.e., the area within the outer periphery 81 of the n-doped region 84, is less than that required for the two vias employed in the diode structure of FIG. 13, i.e, less than the combined areas of the vias 60a and 70, thus permitting the construction of a photodetector array of smaller pixel size and greater resolution.

It may now be understood that the process of the present invention affords several technical advantages over prior-art methods. By the use of a chemically reactive etching procedure for both forming a via and, at the same time, effecting n-type conversion within the region of the p-doped Group II—Group VI material adjacent the via, photodiodes of high sensitivity and relatively small cross-section are provided. The method eliminates several processing steps which are required in prior-art, wet etching methods, including the requirement for type converting localized portions of a Group II—Group VI structure after the completion of the via formation process. The method is more selective and controllable than prior-art, ion milling processes, and the size of the n-doped regions are predictable and may be readily controlled. In an application in which multiple photodiode devices are to be formed in a Group II-Group VI structure in association with a supporting integrated circuit, e.g., for forming an IR sensitive photodiode array, the present invention is applicable for providing photodiodes of very small diameters, thereby permitting the fabrication of photodiode arrays of high resolution. Additionally, the process is of practicable application in the commercial production of semiconductor devices, in that relatively few processing steps are entailed, and the formation of the vias and n-doped regions, and their electrical connection with the integrated circuit conductive pads, may be conveniently accomplished by reactive etching and the subsequent application of conductive layers on the vias and conductive pads.

In summary, a method for forming n-p via junctions of small diameter has been disclosed utilizing a reactive plasma for etching and type converting various compositions formed of Group II and Group VI elements. As discussed above, a hydrogen ($H_2$)+hydrogen carbon ($C_yH_x$) gas mixture can be used in essentially any proportion, and any suitable hydrocarbon compound may be used. Whereas an in situ reactive ion etching process is preferred, various other means for forming the chemically reactive gaseous species are suitably employed in alternative embodiments.

Although the present invention and its advantages have been described in detail, it should be understood that various changes, substitutions and alterations can be made herein without departing from the spirit and scope of the invention as defined by the appended claims.

What is claimed is:

1. A method for type conversion comprising the steps of:
   providing a p-doped body containing Group II and Group VI elements;
   forming activated, reactive gaseous species; and
   applying the reactive gaseous species to portions of the p-doped body for type converting and etching at least one localized portion of the body.

2. The method of claim 1, wherein the Group II and Group VI elements are selected from the group consisting of mercury, cadmium, tellurium, zinc, sulfur, selenium, and combinations thereof 3. The method of claim 1, wherein the p-doped body is formed of a material selected from the group consisting of vacancy doped p-type mercury cadmium telluride, vacancy doped p-type mercury zinc telluride, and vacancy doped p-type mercury manganese telluride.

4. The method of claim 1, wherein the step of forming reactive gaseous species comprises introducing a hydrogen and/or hydrocarbon gas to a low pressure inside a vacuum chamber containing the p-doped body; and
   activating the gas for generating an in situ plasma within the chamber to produce activated radicals for reactively etching the p-doped body.

5. The method of claim 4, wherein the hydrocarbon gas is selected from the group consisting of methane, ethane, propane, and combinations thereof.

6. The method of claim 4, further comprising controlling the flow rate of the hydrocarbon gas into the chamber in order to control the etching rate.

7. The method of claim 4, further comprising the step of controlling the temperature of the p-doped body in the chamber between approximately 15 degrees centigrade and approximately 180 degrees centigrade.

8. The method of claim 4, further comprising the step of adding an inert gas to the vacuum chamber to act as a buffer.

9. A method for forming a diode, comprising:
   providing a p-doped body made of Group II and Group VI elements;
   forming a photoresist layer, having an opening, on a surface of the p-doped body;
   forming activated gaseous species which are chemically reactive with the Group II and Group VI elements;
   dry etching the body with the activated gaseous species for sufficient time to form a via within the body and to convert a localized region of the body adjacent the via to an n-type conductivity state and thereby form an n-p diode junction between the localized region of n-doped material and the remaining, p-doped material.

10. The method of claim 9, further comprising the step of mounting the p-doped body on a surface of a circuit device, the circuit device having an electrically conductive input element at said surface of the circuit device.

11. The method of claim 10, further comprising the step of providing electrical connection between the n-doped region and the electrically conductive input element.

12. The method of claim 11, wherein the step of providing electrical connection between the n-doped region and the electrically conductive input element of the circuit device comprises forming an electrically conductive structure in electrical contact with both the n-doped region and the electrically conductive input element.

13. The method of claim 12, wherein the step of providing electrical connection between the n-doped region and the electrically conductive input element comprises depositing an electrically conductive layer over the n-doped region and the electrically conductive input element.

14. The method of claim 10, wherein the step of applying a photoresist layer on the p-doped body includes positioning the opening in alignment over the electrically conductive input element.

15. The method of claim 10, wherein the step of applying a photoresist layer on the p-doped body includes positioning the opening in a location which is laterally displaced relative to the electrically conductive input element, and wherein the via and the n-doped region is laterally offset from the electrically conductive input element.

16. The method of claim 15, further comprising the step of providing electrical contact between the n-doped region and the electrically conductive input element.

17. The method of claim 15, wherein the step of dry etching the body is terminated when the via extends partially within the p-doped body.

18. The method of claim 15, wherein said via comprises a lateral via, and wherein the step of providing electrical contact between the n-doped region and the electrically conductive input element includes the formation of another via constituting a vertical via penetrating the body and positioned in alignment with the electrically conductive input element, and wherein the step of providing electrical contact between the n-doped region and the electrically conductive input element comprises forming an electrically conductive layer extending between the first and second vias and having electrical contact with the n-doped region and the electrically conductive input element.

* * * * *